United States Patent
Rao et al.

(10) Patent No.: US 7,774,176 B2
(45) Date of Patent: Aug. 10, 2010

(54) CALCULATING INTERMODULATION PRODUCTS AND INTERCEPT POINTS FOR CIRCUIT DISTORTION ANALYSIS

(75) Inventors: Fangyi Rao, San Jose, CA (US); Dan Feng, Los Altos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1273 days.

(21) Appl. No.: 11/303,049

(22) Filed: Dec. 14, 2005

(65) Prior Publication Data

US 2007/0136045 A1 Jun. 14, 2007

(51) Int. Cl.
*G06F 17/50* (2006.01)
(52) U.S. Cl. .......................... 703/2; 703/13; 455/67.13; 324/520
(58) Field of Classification Search ............... 703/2, 703/13; 455/67.13; 330/149; 324/520
See application file for complete search history.

(56) References Cited

U.S. PATENT DOCUMENTS

| | | | |
|---|---|---|---|
| 6,529,844 B1 * | 3/2003 | Kapetanic et al. ............. 702/85 |
| 2003/0179041 A1 * | 9/2003 | Weldon ....................... 330/149 |
| 2003/0222652 A1 * | 12/2003 | Martens ...................... 324/520 |
| 2004/0169559 A1 * | 9/2004 | Weldon ....................... 330/149 |
| 2004/0171351 A1 * | 9/2004 | Nakazawa et al. ........ 455/67.13 |
| 2005/0021319 A1 * | 1/2005 | Li et al. .......................... 703/2 |

OTHER PUBLICATIONS

J. Bussgang, L. Ehrman, and J. Graham. Analysis of nonlinear systems with multiple inputs. Proc. IEEE, 62:1088-1119, Aug. 1974.

S. Chisholm and L. Nagel. Efficient computer simulation of distortion in electronic circuits. IEEE Trans. on Circuits and Systems, 20(6):742-745, Nov. 1973.

P. Feldmann, B. Melville, and D. Long. Efficient frequency domain analysis of large nonlinear analog circuits. Proc. Custom Integrated Circuits Conf., pp. 461-464, 1996.

D. Feng, J. Phillips, K. Nabors, K. Kundert, and J. White. Efficient computation of quasi-periodic circuit operating conditions via a mixed frequency/time approach. Proc. of 36th DAC pp. 635-640, Jun. 1999.

J. Haywood and Y. L. Chow. Intermodulation distortion analysis using a frequency-domain harmonic balance technique. IEEE Trans. on Microwave Theory and Techniques, 36(8):1251-1257, Aug. 1988.

(Continued)

*Primary Examiner*—Thai Phan
(74) *Attorney, Agent, or Firm*—Schwegman, Lundberg & Woessner, P.A.

(57) ABSTRACT

A pertubative approach based on the Born approximation resolves weakly nonlinear circuit models without requiring explicit high-order device derivatives. Convergence properties and the relation to Volterra series are discussed. According to the disclosed methods, second and third order intermodulation products (IM2, IM3) and intercept points (IP2, IP3) can be calculated by second and third order Born approximations under weakly nonlinear conditions. A diagrammatic representation of nonlinear interactions is presented. Using this diagrammatic technique, both Volterra series and Born approximations can be constructed in a systematic way. The method is generalized to calculate other high-order nonlinear effects such as IMn (nth order intermodulation product) and IPn (nth order intermodulation intercept point). In general, the equations are developed in harmonic form and can be implemented in both time and frequency domains for analog and RF circuits.

37 Claims, 10 Drawing Sheets

OTHER PUBLICATIONS

Y. Kuo. Distortion analysis of bipolar transistor circuits. IEEE Trans. on Circuits and Systems, 20(6):709-716, Nov. 1973.

B. Leon and D. Schaefer. Volterra series and picard iteration for nonlinear circuits and systems. IEEE Trans. on Circuits and Systems, 25(9):789-793, Sep. 1978.

P. Li and L. Pileggi. Efficient per-nonlinearity distortion analysis for analog and rf circuits. IEEE Trans. on Computer-Aided Design of Integrated Circuits and Systems, 22(10):1297-1309, Oct. 2003.

S. Narayanan. Application of volterra series to intermodulation distortion analysis of transistor feedback amplifiers. IEEE Trans. on Circuits and Systems, 17(4):518-527, Nov. 1970.

R. Telichevesky, K. Kundert, and J. White. Efficient ac and noise analysis of two-tone rf circuits. Proc. of 33th DAC pp. 292-297, Jun. 1996.

P. Wambacq, G. Gielen, P. Kinget, and W. Sansen. High-frequency distortion analysis of analog integrated circuits. IEEE Trans. on Circuits and Systems II, 46(3):335-345, Mar. 1999.

F. Yuan and A. Opal. Distortion analysis of periodically switched nonlinear circuits using time-varying volterra series. IEEE Trans. on Circuits and Systems I, 48(6):726-738, Jun. 2001.

U.S. Appl. No. 11/640,137, filed Dec. 14, 2006; inventor Fangyi Rao.

* cited by examiner

Rapid IM2/IP2 Flow Chart

Diagram of *2nd* order intermodulation interactions at RF harmonic $\omega_1 - \omega_2$ Diagrams of 3rd order intermodulation interactions at RF harmonic $2\omega_1 - \omega_2$ Diagram of 4th order intermodulation interactions at RF harmonic $\omega_1 - \omega_2$ Numbers of active and passive elements and
number of nodes in test circuits

| name | type | active | passive | nodes |
|---|---|---|---|---|
| LNA | LNA | 28 | 2608 | 520 |
| Mixer1 | LNA+Mixer | 78 | 400 | 216 |
| Mixer2 | LNA+Mixer+LPF | 2585 | 7758 | 3102 |
| Mixer3 | Mixer | 33 | 225 | 240 |
| Mixer4 | LNA+Mixer+LPF | 1893 | 9482 | 4460 |

FIG. 6

RF and LO frequencies (in Hz) in test circuits

| circuit | RF1 | RF2 | LO |
|---|---|---|---|
| LNA | 2.45G | 2.451G | -- |
| Mixer1 | 1.9608G | 1.96168G | 1.96G |
| Mixer2 | 2.4424G | 2.4426G | 2.44G |
| Mixer3 | 2.4G | 2.41G | 2.45G |
| Mixer4 | 1.9608G | 1.96168G | 1.96G |

FIG. 7

IM2 (in Voltage) obtained from *2nd* order Born approximation and 3-tone HB simulation.

| circuit | RF magnitude | perturbation | 3-tone HB |
|---|---|---|---|
| Mixer1 | 0.0002V | 3.21408e-7 | 3.21408e-7 |
|  | 0.002V | 3.21453e-5 | 3.21477e-7 |
| Mixer2 | 0.0001V | 7.70152e-8 | 7.70667e-8 |
|  | 0.0002V | 3.08356e-7 | 3.08793e-7 |

FIG. 8

IM3 (in voltage) obtained from 3rd order Born approximation and 2/3-tone HB simulation.

| circuit | RF mag/power | perturbation | 2/3-tone HB |
|---|---|---|---|
| LNA | -48dBm | 1.48133e-8 | 1.48137e-8 |
|  | -42dBm | 1.17984e-7 | 1.17998e-7 |
| Mixer2 | 0.0001V | 1.16353e-7 | 1.16570e-7 |
|  | 0.0002V | 9.22698e-7 | 9.20293e-7 |
| Mixer3 | -56dBm | 3.70448e-7 | 3.72177e-7 |
|  | -48dBm | 2.96239e-6 | 2.91636e-6 |
| Mixer4 | 0.0002V | 2.38959e-7 | 2.39116e-7 |
|  | 0.002V | 2.38947e-4 | 2.40345e-4 |

FIG. 9

CPU time (in seconds) in IM2/IM3 calculations
with Born approximation and 2/3-tone HB simulation

|  | perturbation | 2/3-tone HB |
|---|---|---|
| Mixer1 IM2 | 10 | 48 |
| Mixer2 IM2 | 268 | 1260 |
| LNA IM3 | 0.78 | 5 |
| Mixer2 IM3 | 385 | 1260 |
| Mixer3 IM3 | 12 | 60 |
| Mixer4 IM3 | 629 | 2124 |

FIG. 10

CALCULATING INTERMODULATION PRODUCTS AND INTERCEPT POINTS FOR CIRCUIT DISTORTION ANALYSIS

BACKGROUND OF THE INVENTION

The present invention relates to the analysis of circuits generally and more particularly to the distortion analysis of analog and RF (Radio Frequency) circuits by calculating intermodulation products and intercept points.

Second and third order intermodulation intercept points (IP2 and IP3) are critical design specifications for circuit nonlinearity and distortion. A rapid yet accurate method to compute IP2/IP3 is of great importance in complex RF and analog designs. Conventional computer-aided-design solutions for measuring IP2/IP3 are typically based on multi-tone simulations. For a circuit with a DC (Direct Current) operating point such as a LNA (Low Noise Amplifier), a two-tone simulation is performed at two RF input frequencies $\omega_1$ and $\omega_2$ (usually closely spaced). When the RF power level is low enough, signals at frequencies $\omega_1-\omega_2$ and $2\omega_1-\omega_2$ are dominated by second and third order nonlinear effects respectively, and higher order contributions are negligible compared to the leading-order terms. Thus, solutions at $\omega_1-\omega_2$ and $2\omega_1-\omega_2$ can be used as second and third order intermodulation products (IM2 and IM3) to extrapolate intercept points for IP2 and IP3. For a circuit with a periodic time-varying operating point such as a mixer or a switch capacitor filter, a three-tone simulation at $\omega_1$, $\omega_2$ and the LO (local oscillator) or clock frequency $\omega_c$ can be conducted and IM3 can be measured at frequency $2\omega_1-\omega_2-\omega_c$ [8, 13, 3, 4].

Because of the low RF power setting, very high accuracy is typically required in order to obtain reliable intermodulation results. Particularly in three-tone cases, the numerical dynamic range has to accommodate the large LO signal, the small RF signals, and the nonlinear distortions. Furthermore, a multi-tone simulation is generally inefficient for IP2/IP3 measurements because, in addition to IM2 and IM3 harmonics, this approach also resolves other irrelevant frequencies to all nonlinear orders. This additional overhead can be very expensive in large designs with thousands of transistors.

Essentially, IP2/IP3 calculation is a weakly nonlinear problem. It is substantially concerned with only the leading second or third order effects. The fully converged multi-tone solution that contains every order of nonlinearity is generally unnecessary. A more efficient way is to treat both RF inputs as perturbation to the operating point solution and apply 2nd or 3rd order perturbation theory to calculate IM2 or IM3 at the relevant frequency directly. In this way, the dynamic range is reduced to cover just the RF excitations. The most commonly used perturbative method for distortion analysis is the Volterra series [12, 2, 7, 1, 11, 5, 16, 17]. However, this approach requires second and higher order derivatives of nonlinear devices. In the cases of IP2 and IP3, up to 2nd and 3rd order derivatives are needed respectively. This limits the application of Volterra series in many circuit simulations since most device models don't provide derivatives higher than first order. Also, as the order of Volterra series increases, the complexity of tracking the polynomials grows substantially, and the implementation becomes more and more complicated.

Thus, there is a need for improved calculation of intermodulation intercept points and other characteristics of circuit distortion analysis.

SUMMARY OF THE INVENTION

In one embodiment of the present invention, a method of analyzing distortion in a circuit includes: determining an operating point for the circuit, where the circuit has a linear offset and a nonlinear offset at the operating point; determining a first-order solution from the linear offset and an input having a first input frequency and a second input frequency; determining a harmonic component of the nonlinear offset at a difference between the first input frequency and the second input frequency; and determining a second-order solution from the linear offset and the harmonic component of the nonlinear offset at the difference between the first input frequency and the second input frequency. The second-order solution provides an estimate for a second-order intermodulation product for the circuit.

According to one aspect of this embodiment, the method may further include determining an estimate for a second-order intercept point for the circuit from the second-order solution and the first-order solution. Determining the estimate for the second-order intercept point may further include calculating an intersection between a linear representation of the second-order solution and a linear representation of the first-order solution, where the linear representation of the second-order solution has a slope of about 2 dB/dB and the linear representation of the first-order solution has a slope of about 1 dB/dB. (Ideally these slopes are exactly 2 dB/dB and 1 dB/dB respectively.) Determining the linear representation of the first-order solution may further include extracting a component from the first-order-solution corresponding to one of the first frequency and the second frequency.

According to another aspect, the operating point may be a DC (direct current) operating point or a periodic operating point. According to another aspect, determining the harmonic component of the nonlinear offset at the difference between the first input frequency and the second input frequency may includes: calculating a DFT (Discrete Fourier Transform) of the nonlinear offset; and selecting a component of the DFT at the difference between the first input frequency and the second input frequency. According to another aspect the circuit may be an analog or RF circuit.

In another embodiment of the present invention, a method of analyzing distortion in a circuit, includes: determining an operating point for the circuit, where the circuit has a linear offset and a nonlinear offset at the operating point; determining a first-order solution from the linear offset and an input having a first input frequency and a second input frequency; determining a harmonic component of the nonlinear offset at a difference between the first input frequency and the second input frequency; determining a harmonic component of the nonlinear offset at twice the first input frequency; determining a second-order solution from the linear offset and the harmonic component of the nonlinear offset at the difference between the first input frequency and the second input frequency; determining a second-order solution from the linear offset and the harmonic component of the nonlinear offset at twice the first input frequency; determining a harmonic component of the nonlinear offset at a difference between twice the first input frequency and the second input frequency; and determining a third-order solution from the linear offset and the harmonic component of the nonlinear offset at the difference between twice the first input-frequency and the second input frequency. The third-order solution provides an estimate for a third-order intermodulation product for the circuit.

This embodiment may include aspects described above. According to another aspect, the method may further include: determining an estimate for a third-order intercept point for the circuit from the third-order solution and the first-order solution. Determining the estimate for the third-order intercept point may further include calculating an intersection between a linear representation of the third-order solution and a linear representation of the first-order solution, where the linear representation of the third-order solution has a slope of about 3 dB/dB and the linear representation of the first-order solution has a slope of about 1 dB/dB. (Ideally these slopes are exactly 3 dB/dB and 1 dB/dB respectively.) Determining the linear representation of the first-order solution may further include extracting a component from the first-order-solution corresponding to one of the first frequency and the second frequency.

Additional embodiments relate to an apparatus that includes a computer with instructions for carrying out any one of the above-described methods and a computer-readable medium that stores (e.g., tangibly embodies) a computer program for carrying out any one of the above-described methods.

In this way the present invention enables improved calculation of intermodulation intercept points (e.g., IP2, IP3) and other characteristics of circuit distortion analysis (e.g., IM2, IM3).

BRIEF DESCRIPTION OF THE DRAWINGS

FIGS. 6, 7, 8, 9, and 10 show features of simulations related to the embodiments shown in FIGS. 1 and 2.

DETAILED DESCRIPTION OF EXEMPLARY EMBODIMENTS

1 Introduction

Figure 1:
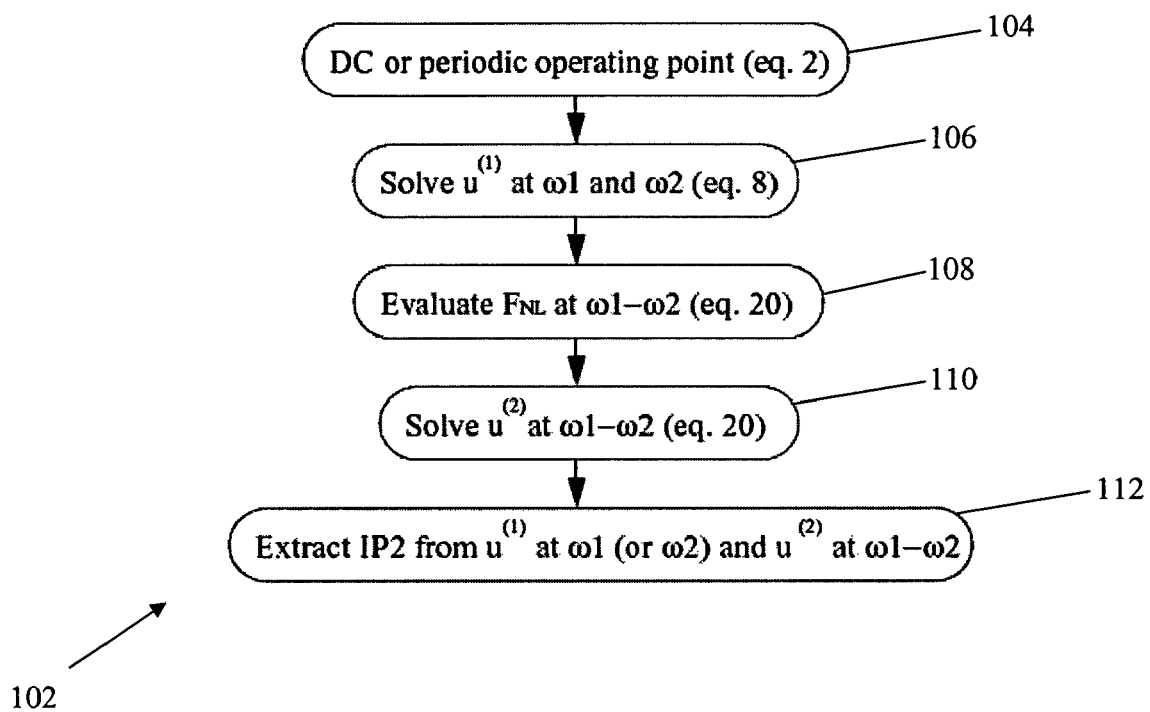
FIG. 1 shows an exemplary method for calculating second-order intermodulation products and intercept points according to an embodiment of the present invention.

This description presents embodiments of the present invention directed towards the distortion analysis of circuits. A pertubative approach based on the Born approximation resolves weakly nonlinear circuit models without requiring explicit high-order device derivatives. Convergence properties and the relation to Volterra series are discussed. According to the disclosed methods, IP2 and IP3 can be calculated by 2nd and 3rd order Born approximations under weakly nonlinear conditions. A diagrammatic representation of nonlinear interactions is presented. Using this diagrammatic technique, both Volterra series and Born approximations can be constructed in a systematic way. The method is generalized to calculate other high-order nonlinear effects such as IMn (nth order intermodulation product) and IPn (nth order intermodulation intercept point). In general, the equations are developed in harmonic form and can be implemented in both time and frequency domains for analog and RF circuits.

First, analytical details for the Born approximation in weakly nonlinear circuits are discussed. Next methods for calculating IP2 and IP3 are presented. Next diagrammatic representations are discussed. Next computational results are discussed. In the conclusion additional embodiments are discussed.

2 The Born Approximation in Weakly Nonlinear Circuits

Consider nonlinear circuit equation $$\frac{d}{dt}q(V(t)) + i(V(t)) = B(t) + \epsilon \cdot s(t) \quad (1)$$

where B is the operating point source (e.g., LO or clock signal) and s is the RF input source. Typically, the input s represents a single frequency source (e.g., $\sin(\omega_1 t)$) or a sum of frequency sources (e.g., $\sin(\omega_1 t)+\sin(\omega_2 t)$). The parameter $\epsilon$ is introduced to keep track of the order of perturbation expansion and is set equal to 1 at the end of the calculations. For simplicity, we use F(v) to denote LHS (left hand side) in equation (1). Assume $V_0$ is the operating point at zero RF input so that $V_0$ satisfies the equation $$F(V_0)=B. \quad (2)$$

For a LNA (low noise amplifier), $V_0$ is the DC solution. For a mixer or switch capacitor filter, $V_0$ is the periodic steady-state solution under B, and its fundamental frequency is the LO or clock frequency $\omega_c$. Expanding equation (1) around $V_0$, we have $$F(V_0)+L\cdot v+F_{NL}(V_0,v)=B+\epsilon\cdot s \quad (3)$$

where v is the circuit response to RF signal s. Operator L is the linearization of the LHS in equation (1) and is defined as $$L\cdot v = \frac{d}{dt}\left(\frac{\partial}{\partial V}q(V_0)\cdot v\right) + \frac{\partial}{\partial V}i(V_0)\cdot v. \quad (4)$$

For periodic $V_0(t)$, L is also periodic and has the same fundamental frequency as $V_0$ at $\omega_c$. $F_{NL}$ in equation (3) is defined as $$F_{NL}(V_0, v)=F(V_0+v)-F(V_0)-L\cdot v. \quad (5)$$

That is, $F_{NL}$ is the sum of all nonlinear terms of the circuit. Combining equations (2) and (3), we have the equation for v:

$$L\cdot v+F_{NL}(V_0,v)=\epsilon\cdot s. \quad (6)$$

In most analog designs, the circuit functions in a nearly linear region. In particular, IP2/IP3 measurements requires very low RF power level so only the leading order terms are involved. Under such a weakly-nonlinear condition, the nonlinear term $F_{NL}$ is small compared to the linear term $L\cdot v$. We can treat $F_{NL}$ as a perturbation and solve v iteratively:

$$u^{(n)}=v^{(1)}-L^{-1}\cdot F_{NL}(u^{(n-1)}). \quad (7)$$

Here, $u^{(n)}$ is the approximation of v at the nth iteration. And $v^{(1)}$ is the small signal solution of order $O(\epsilon)$ obtained from AC (alternating current) or periodic AC analysis:

$$L\cdot v^{(1)}=\epsilon\cdot s. \quad (8)$$

Then in equation (7), $u^{(n)}$ is defined for $n\geq 2$ where $u^{(1)}$ is defined as $v^{(1)}$. Equation (7) is called the Born approximation or Picard iteration [14, 9, 10]. It is equivalent to successive AC calculations with $F_{NL}(u^{(n-1)})$ being the small signal. As shown in equation (5), the evaluation of $F_{NL}$ is based on the nonlinear device function F and its first derivative. No higher order derivative is needed. This allows us to carry out any order of perturbation without modifications in current device models. Also, the dynamic range of $u^{(n)}$ depends only on RF signals. This gives the perturbative approach advantages in terms of accuracy.

To estimate the error of $u^{(n)}$, subtract equation (6) from equation (7) and linearize around v:

$$u^{(n)} - v = -L^{-1} \cdot \left[ \frac{\partial}{\partial v} F_{NL}(v) \cdot (u^{(n-1)} - v) \right] + \ldots \quad (9)$$

Recall $F_{NL}$ is a nonlinear function of v. Its lowest order is $O(v^2)$. Therefore, we have:

$$\|u^{(n)} - v\| \propto \epsilon \cdot \|u^{n-1)} - v\|. \quad (10)$$

Since $\|v^{(1)} - v\| \propto O(\epsilon^2)$, we have:

$$\|u^{(n)} - v\| \propto O(\epsilon^{n+1}) \quad (11)$$

and $$\|u^{(n)} - u^{(n-1)}\| \propto O(\epsilon^n). \quad (12)$$

Equations (11) and (12) indicate that $u^{(n)}$ is accurate to the order of $O(\epsilon^n)$ and the Born approximation converges by $O(\epsilon^n)$.

In the situation where LO and RF frequencies are incommensurate with each other for a particular harmonic $\Sigma_i k_i \cdot \omega_i + m \cdot \omega_c$ ($\omega_i$ is the frequency of an RF signal), its leading order is $O(\epsilon^{\Sigma_i |k_i|})$ and the next leading order is $O(\epsilon^{2+\Sigma_i |k_i|})$. As a result, when n is even, the error in $u^{(n)}$ is of order $O(\epsilon^{n+2})$ for even harmonics ($\Sigma k_i$ is even) and of order $O(\epsilon^{n+1})$ for odd harmonics ($\Sigma k_i$ is odd), and vice versa when n is odd. (That is, when n is odd the error is of order $O(\epsilon^{n+2})$ for odd harmonics and of order $O(\epsilon^{n+1})$ for even harmonics.)

The Born approximation is closely related to Volterra series. The connection between them was pointed out by Leon and Schaefer [9] and by Li and Pileggi [10]. In the Volterra series, the nth term $v^{(n)}$ is the exact Taylor expansion of v in terms of parameter $\epsilon$ and $v^{(n)} \propto \epsilon^n$. Because the nth order Born approximation is accurate to $O(\epsilon^n)$ as shown in equation (11), $u^{(n)}$ is equal to the sum of Volterra series up to $v^{(n)}$ plus higher order terms:

$$u^{(n)} = v^{(1)} + v^{(2)} + \ldots + v^{(n)} + O(\epsilon^{n+1}). \quad (13)$$

Furthermore, for incommensurate frequencies, when n is even, the difference between the Born approximation and the Volterra series is of order $O(\epsilon^{n+2})$ at even harmonics and of order $O(\epsilon^{n+1})$ at odd harmonics, and vice versa when n is odd. (That is, when n is odd the error is of order $O(\epsilon^{n+2})$ for odd harmonics and of order $O(\epsilon^{n+1})$ for even harmonics.)

Equation (7) can be simplified in the form of RF harmonics. Expanding v with Fourier coefficients $v(\omega, m)$ gives:

$$v(t) = \sum_\omega \sum_m v(\omega, m) e^{j(\omega + m\omega_c)t} \quad (14)$$

where $\omega = \Sigma_i k_i \cdot \omega_i$ is the RF harmonic frequency. Here we consider the DC operating point as a special case with $\omega_c = 0$. We define RF harmonic $v_\omega(t)$ as $$v_\omega(t) = \sum_m v(\omega, m) e^{j(\omega + m\omega_c)t}, \quad (15)$$

and equation (14) becomes $$v(t) = \sum_\omega v_\omega(t). \quad (16)$$

It should be emphasized that $v_\omega$ is not the Fourier transform of v because it's still a function of time. It's the harmonic component of frequency $\omega$ in v. As shown in equation (15), $v_\omega$ carries frequency $\omega$ and all the sidebands of $\omega_c$. Note that operator L has only $\omega_c$ harmonics. When frequencies $\omega_i$ are incommensurate with $\omega_c$, RF harmonics are orthogonal to each other in equation (7) and $u_\omega$ can be solved independently $$u_\omega^{(n)} = v_\omega^{(1)} - L^{-1} \cdot F_{NL,\omega}(u^{(n-1)}). \quad (17)$$

To calculate harmonics of $F_{NL}$, we label $u_\omega$ and $F_{NL,\omega}$ with index vector $\vec{k} = (k_1, k_2, \ldots)$ as $u_{\vec{k}}$ and $F_{NL,\vec{k}}$. For incommensurate $\omega_i$ and $\omega_c$, $\vec{k}$ is uniquely determined by $\omega$. The following scaling law holds for algebraic functions q(V) and i(V):

$$F_{NL}\left(\sum_{\vec{k}'} e^{j\vec{k}' \cdot \vec{\theta}} u_{\vec{k}'}(t)\right) = \sum_{\vec{k}} e^{j\vec{k} \cdot \vec{\theta}} \cdot F_{NL,\vec{k}}(u(t)). \quad (18)$$

Equation (18) demonstrates that if we multiply every $u_{\vec{k}}$ with a factor $e^{j\vec{k} \cdot \vec{\theta}}$ and compute $F_{NL}$, then $F_{NL,\vec{k}}$ is the Fourier transform of $F_{NL}$ as a function of $\vec{\theta}$. Using multidimensional DFT (Discrete Fourier Transform), we calculate $F_{NL,\vec{k}}$ as $$F_{NL,\vec{k}}(u(t)) = \sum_{\vec{\theta}} \Gamma(\vec{k}, \vec{\theta}) \cdot F_{NL}\left(\sum_{\vec{k}'} e^{j\vec{k}' \cdot \vec{\theta}} u_{\vec{k}'}(t)\right) \quad (19)$$

where $\Gamma(\vec{k}, \vec{\theta})$ is the DFT matrix and $\vec{\theta}$ is uniformly distributed in $(-\pi, \pi)$ for each $\theta_i$. Equation (19) has also been used in harmonic balance for frequency domain function evaluation [3]. It is equivalent to calculating derivatives of F(V) numerically. Therefore, although high-order device derivatives are absent from equation (17), accurate nonlinear calculations still require smooth I/V or Q/V characteristics over the range of voltages or currents in which the circuit operates.

Equation (17) can be implemented in both time and frequency domains [15]. In a frequency representation, $u_\omega$ and $F_{NL,\omega}$ are expanded with $\omega_c$ harmonics as in equation (15).

3 IP2 and IP3 Calculations

In the 2nd order Born approximation, $u_{\omega_1 - \omega_2}^{(2)}$ is accurate to the leading order $O(\epsilon^2)$. The next-order terms are of order $O(\epsilon^4)$, and they are negligible compared to $O(\epsilon^2)$ terms when RF input signals are weak. Therefore, we can use $u_{\omega_1 - \omega_2}^{(2)}$ at a low RF power level as an estimate for IM2 to calculate IP2. We can solve for $u_{\omega_1-\omega_2}^{(2)}$ from the linear solution $u^{(1)}$:

$$u_{\omega_1-\omega_2}^{(2)} = -L^{-1} \cdot F_{NL,\omega_1-\omega_2}(u^{(1)}) \quad (20)$$

This computation takes one DC or periodic steady-state calculation at zero RF input and three AC or periodic AC solutions (two for $u^{(1)}$ and one for $u^{(2)}$). Unlike multi-tone simulations, where the size of the Jacobian matrix is proportional to the number of harmonics used, the size of L in the perturbation is independent of harmonic number, which affects only function evaluation in equation (19).

This process is summarized in FIG. 1. A method 102 for calculating IM2/IP2 begins with determining 104 an operating point for the circuit. The operating point can be a single point (e.g., a DC operating point) or an interval (e.g., a periodic operating point). Once an operating point is set, a linear offset (e.g., L in eq. (4)) and a nonlinear offset (e.g., $F_{NL}$ in eq. (5)) can be determined for perturbation analysis about the operating point. Next, a first-order solution (e.g., $u^{(1)}=v^{(1)}$ in eq. (8)) can be determined 106 from the linear offset and an input (e.g., s in eq. (8)) having a first input frequency (e.g., $\omega_1$) and a second input frequency (e.g., $\omega_2$). For example, we can take $s=s_1+s_2$ where $s_1=\sin(\omega_1 t)$ and $s_2=\sin(\omega_2 t)$, and where the solutions can be obtained separately for each frequency and summed because of the linearity of equation (8). These two frequencies are typically close in value (e.g., $\omega_1 \approx \omega_2$).

Next a harmonic component of the nonlinear offset can be determined 108 at a difference between the first input frequency and the second input frequency (e.g., $F_{NL}$ at $\omega_1-\omega_2$ in eq. (20)). Next a second-order solution (e.g., $u^{(2)}$ at $\omega_1-\omega_2$ in eq. (20)) can be determined 110 from the linear offset and the harmonic component of the nonlinear offset at the difference between the first input frequency and the second input frequency. As discussed above, this second-order solution provides an estimate for the second-order intermodulation product (IM2) for the circuit.

The method 102 can be extended by determining 112 an estimate for a second-order intercept point (e.g., IP2) for the circuit from the second-order solution and the first-order solution. Typically, this includes calculating an intersection on a log-log scale between a linear representation of the second-order solution and a linear representation of the first-order solution. Ideally, the linear representation of the second-order solution has a slope of 2 dB/dB and the linear representation of the first-order solution has a slope of 1 dB/dB. Typically, only one frequency is used for the characterization of the first-order solution so that a component corresponding to either the first frequency (e.g., $\omega_1$) or the second frequency (e.g., $\omega_2$) is extracted from the first-order solution. Details for calculating intermodulation intercept points from intermodulation products (e.g, calculating IP2 from IM2 and IP3 from IM3) are well-known in the art of circuit analysis (e.g., [8] at p. 298, [13] at p. 18).

Similarly, for the IP3 calculation we can use the 3rd order Born approximation $u_{2\omega_1-\omega_2}^{(3)}$ at low power level as an estimate for IM3. It is accurate to the leading order $O(\epsilon^3)$ and next order terms are of $O(\epsilon^5)$. We solve for $u_{2\omega_1-\omega_2}^{(3)}$ from the 2nd order solution $u^{(2)}$:

$$u_{2\omega_1-\omega_2}^{(3)} = -L^{-1} \cdot F_{NL,2\omega_1-\omega_2}(u^{(2)}). \quad (21)$$

Note that the $\epsilon^3$ terms in $u_{2\omega_1-\omega_2}^{(3)}$ arise from second and third order polynomials in $F_{NL}$. Only a handful of RF harmonics in $u^{(2)}$ are involved in $F_{NL,2\omega_1-\omega_2}$ at order $O(\epsilon^3)$. We demonstrate this by expanding $F_{NL}$ in equation (21) with polynomials:

$$u_{2\omega_1-\omega_2}^{(3)} = -L^{-1} \cdot \quad (22)$$

$$\left\{ F_2 \cdot [u_{-\omega_2}^{(1)} \cdot u_{2\omega_1}^{(2)} + u_{\omega_1}^{(1)} \cdot u_{\omega_1-\omega_2}^{(2)}] + \frac{1}{2} F_3 \cdot u_{\omega_1}^{(1)} \cdot u_{\omega_1}^{(1)} \cdot u_{-\omega_2}^{(1)} + O(\epsilon^5) \right\}.$$

In equation (22), the linear operator $F_n$ is the nth derivative of F with respect to V at $V_0$ and is given by $$F_n = \frac{d}{dt}\left(\frac{\partial^n}{\partial V^n} q(V_0)\right) + \frac{\partial^n}{\partial V^n} q(V_0) \cdot \frac{d}{dt} + \frac{\partial^n}{\partial V^n} i(V_0). \quad (23)$$

Without losing accuracy we can write equation (22) as $$u_{2\omega_1-\omega_2}^{(3)} = -L^{-1} \cdot F_{NL,2\omega_1-\omega_2}[u_{\omega_1}^{(1)} + u_{-\omega_2}^{(1)} + u_{2\omega_1}^{(2)} + u_{\omega_1-\omega_2}^{(2)}] + O(\epsilon^5). \quad (24)$$

Equation (24) shows that to solve $u_{2\omega_1-\omega_2}^{(3)}$ to $O(\epsilon^3)$ accuracy, we only need $u_{2\omega_1}^{(2)}$ and $u_{\omega_1-\omega_2}^{(2)}$ from the second order approximation, for which we have $$u_{2\omega_1}^{(2)} = -L^{-1} \cdot F_{NL,2\omega_1}(u^{(1)}) \quad (25)$$

and $$u_{\omega_1-\omega_2}^{(2)} = -L^{-1} \cdot F_{NL,\omega_1-\omega_2}(u^{(1)}). \quad (26)$$

Other harmonics contribute to higher order terms, and therefore can be ignored. The computation takes one DC or periodic steady-state calculation at zero RF input and five AC or periodic AC solutions (two for $u^{(1)}$, two for $u^{(2)}$, and one for $u^{(3)}$). Note that equation (26) is identical to equation (20) so that an estimate for IM2 is also available.

Figure 2:
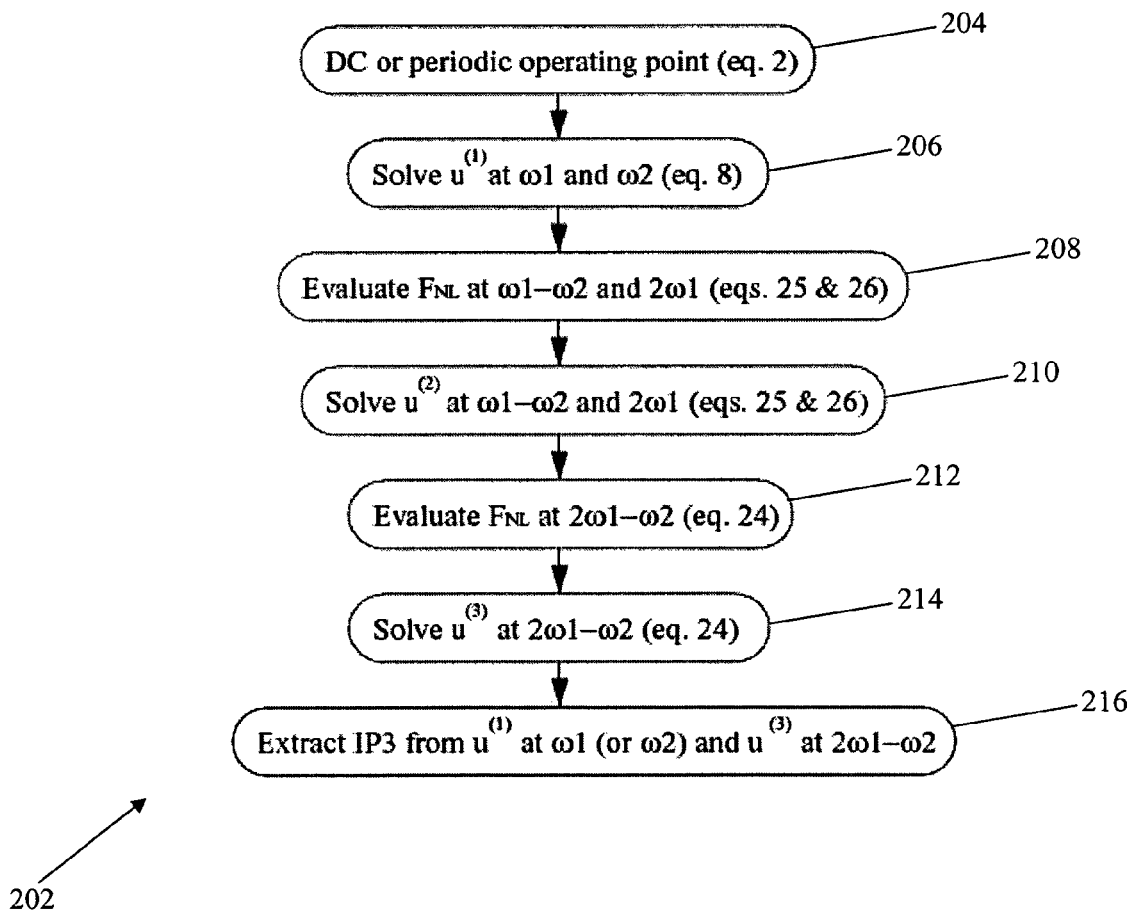
FIG. 2 shows an exemplary method for calculating third-order intermodulation products and intercept points according to an embodiment of the present invention.

This process is summarized in FIG. 2, and the details are similar to the description of FIG. 1 above. A method 202 for calculating IM3/IP3 begins with determining 204 an operating point (e.g., DC or periodic) for the circuit. Once an operating point is set, a linear offset (e.g., L in eq. (4)) and a nonlinear offset (e.g., $F_{NL}$ in eq. (5)) can be determined for perturbation analysis about the operating point. Next, a first-order solution (e.g., $u^{(1)}=v^{(1)}$ in eq. (8)) can be determined 206 from the linear offset and an input (e.g., s in eq. (8)) having a first input frequency (e.g., $\omega_1$) and a second input frequency (e.g., $\omega_2$).

Next a harmonic component of the nonlinear offset can be determined 208 at a difference between the first input frequency and the second input frequency (e.g., $F_{NL}$ at $\omega_1-\omega_2$ in eq. (26)), and a harmonic component of the nonlinear offset can be determined 208 at twice the first input frequency (e.g., $F_{NL}$ at $2\omega_1$ in eq. (25)). Next a second-order solution (e.g., $u^{(2)}$ at $\omega_1-\omega_2$ in eq. (26)) can be determined 210 from the linear offset and the harmonic component of the nonlinear offset at the difference between the first input frequency and the second input frequency, and a second-order solution (e.g., $u^{(2)}$ at $2\omega_1$ in eq. (25)) can be determined 210 from the linear offset and the harmonic component of the nonlinear offset at twice the first input frequency. Next, a harmonic component of the nonlinear offset (e.g., $F_{NL}$ at $2\omega_1-\omega_2$ in eq. (24)), can be determined 212 at a difference between twice the first input frequency and the second input frequency. Next a third-order solution (e.g., $u^{(3)}$ at $2\omega_1-\omega_2$ in eq. (24)) can be determined 214 from the linear offset and the harmonic component of the nonlinear offset at the difference between twice the first input frequency and the second input frequency. As discussed above, this third-order solution provides an estimate for the third-order intermodulation product (IM3) for the circuit.

The method 202 can be extended by determining 216 an estimate for a third-order intercept point (e.g., IP3) for the circuit from the second-order solution and the first-order solution. Typically, this includes calculating an intersection on a log-log scale between a linear representation of the third-order solution and a linear representation of the first-order solution. Ideally, the linear representation of the third-order solution has a slope of 3 dB/dB and the linear representation of the first-order solution has a slope of 1 dB/dB. Details are standard and similar to the above discussion with respect to FIG. 1.

As a heuristic, one can compare the Born approximation with the Volterra series, where IM2 is calculated by $$v_{\omega_1-\omega_2}^{(2)} = -L^{-1} \cdot [F_2 \cdot v_{\omega_1}^{(1)} \cdot v_{-\omega_2}^{(1)}] \tag{27}$$

and IM3 is calculated by $$v_{2\omega_1-\omega_2}^{(3)} = \tag{28}$$
$$-L^{-1} \cdot \left\{ F_2 \cdot [v_{-\omega_2}^{(1)} \cdot v_{2\omega_1}^{(2)} + v_{\omega_1}^{(1)} \cdot v_{\omega_1-\omega_2}^{(2)}] + \frac{1}{2} F_3 \cdot v_{\omega_1}^{(1)} \cdot v_{\omega_1}^{(1)} \cdot v_{-\omega_2}^{(1)} \right\}$$

$$v_{2\omega_1}^{(2)} = -L^{-1} \cdot \left[ \frac{1}{2!} F_2 \cdot v_{\omega_1}^{(1)} \cdot v_{\omega_1}^{(1)} \right] \tag{29}$$

and $$v_{\omega_1-\omega_2}^{(2)} = -L^{-1} \cdot \left[ F_2 \cdot v_{\omega_1}^{(1)} \cdot v_{-\omega_2}^{(1)} \right]. \tag{30}$$

Equations (20) and (24)-(26) can be considered as approximation of equations (27)-(30) by replacing all the $v^{(n)}$ with $u^{(n)}$ and the polynomials with $F_{NL}$. The actual polynomial multiplication happens implicitly when evaluating nonlinear function $F_{NL}$ in the Born approximation. The deviation introduced is of order $O(\epsilon^4)$ for IM2 and $O(\epsilon^5)$ for IM3. Its effects on IP2/IP3 can be estimated by checking the scaling of IM2/IM3 results at different RF power levels. Compared to equations (27)-(30), not only are equations (20) and (24)-(26) free of $F_2$ and $F_3$, but they are also much simpler to implement.

4 Diagrammatic Representation

Equations (27)-(30) are leading order terms in RF harmonics $\omega_1-\omega_2$ and $2\omega_1-\omega_2$. We illustrate them in FIG. 3 and FIG. 4 using diagrams analogous to the well-known Feynman diagrams in quantum field theory [6].

Figure 3:
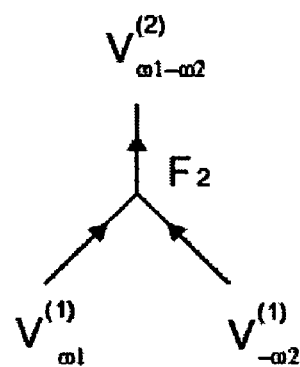
FIG. 3 shows a diagram of 2nd order intermodulation interactions at RF harmonic $\omega_1-\omega_2$.
Figure 4:
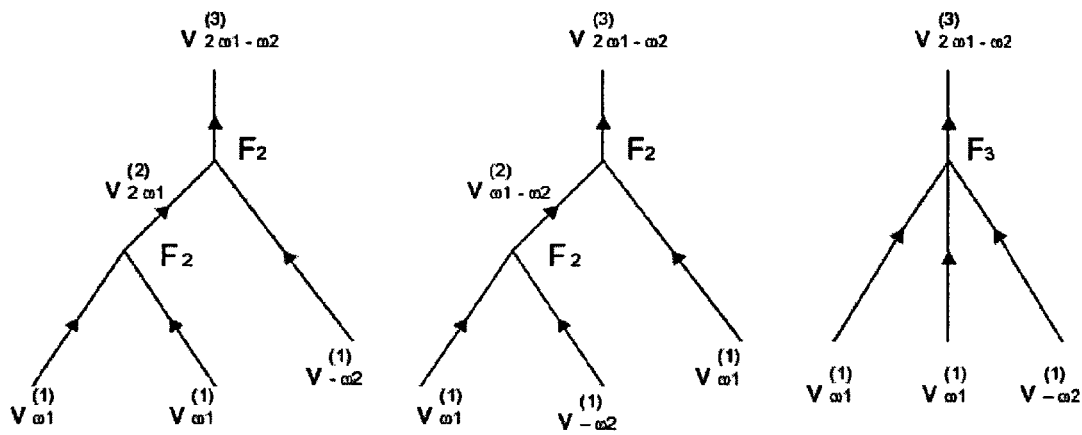
FIG. 4 shows a diagram of 3rd order intermodulation interaction at RF harmonic $2\omega_1-\omega_2$.

In FIGS. 3 and 4, each vertex represents a polynomial in $F_{NL}$. A vertex has one outgoing line and at least two incoming lines. Lines coming into the vertex are lower order solutions involved in the polynomial. The outgoing line is the solution at the current order. The RF frequency at the outgoing line is equal to the sum of the RF frequencies at the incoming lines. The three diagrams in FIG. 4 correspond to three nonlinear terms in the RHS (right-hand side) of equation (28). Using the diagrammatic technique, it's convenient to identify intermediate harmonics we need to solve in lower-order perturbations.

In general, to count all diagrams for a given RF frequency at nth order, one can start with the diagram for the $v^n$ term of the Taylor expansion about the operating point, which is the highest-order polynomial that needs to be considered. All its incoming lines are of first order. With the same outgoing frequency, diagrams of $v^{n-1}$ terms can be constructed by merging a pair of incoming lines in the $v^n$ diagram into a single line. The frequency at the new line is equal to the sum of frequencies at the two merged lines. Similarly, diagrams of other polynomials are obtained by merging more lines. Note that the order of a new line is the sum of orders of lines being merged.

Figure 5:
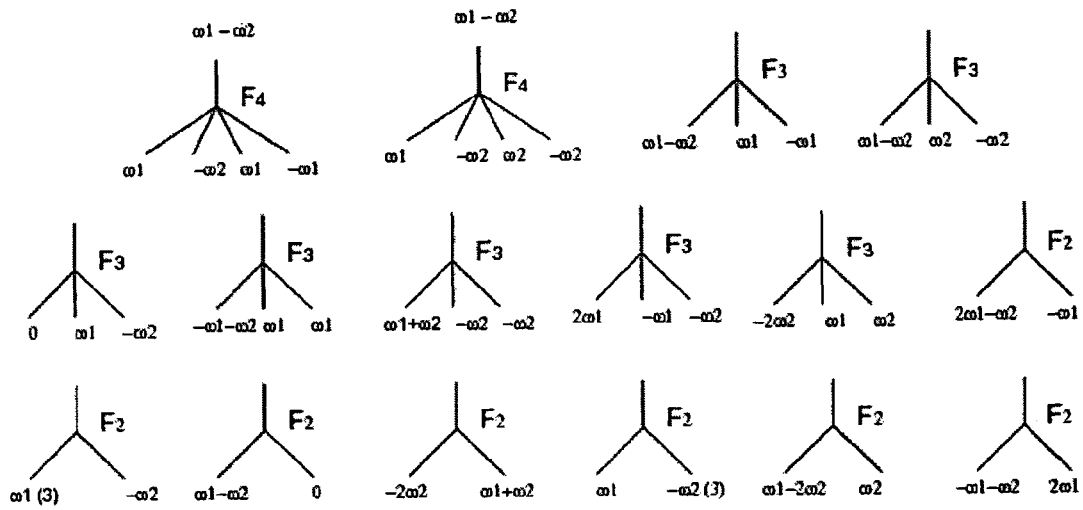
FIG. 5 shows a diagram of 4th order intermodulation interactions at RF harmonic $\omega_1-\omega_2$.

As an example, we draw diagrams of intermodulation $\omega_1-\omega_2$ at 4th order in FIG. 5. All lines are of leading order except for two $F_2$ diagrams that have incoming line $v_{\omega_1}^{(3)}$ or $v_{-\omega_2}^{(3)}$. (See FIG. 5, third row, first and fourth diagrams from the left.) They are identical to the 2nd order diagram shown in FIG. 3 except that the incoming lines in FIG. 3 are $v_{\omega_1}^{(1)}$ and $v_{-\omega_2}^{(1)}$. To distinguish them from the 2nd order diagram, $\omega_1$ or $-\omega_2$ is explicitly marked as 3rd order. FIG. 5 shows that the 4th order calculation of $\omega_1-\omega_2$ takes harmonics $2\omega_1-\omega_2$, $\omega_1-2\omega_2$, $\omega_1$ and $-\omega_2$ from the 3rd order solution and harmonics $\omega_1-\omega_2$, $\omega_1+\omega_2$, $-\omega_1-\omega_2$, $2\omega_1$, $-2\omega_1$ and $0$ from the 2nd order. Employing the technique recursively to lower-order lines, we obtain the list of harmonics need to be solved at each order of the perturbation. The error term in final solution is of order $O(\epsilon^6)$.

In addition, We define the following rules to carry out perturbation calculations directly from the diagrams. For Volterra series we have:

1. To each incoming external line, assign $v_\omega^{(n)}$ where $\omega$ is the RF frequency of the line.

2. To each internal line, assign operator $L^{-1}$, which represents the Green's function or propagator of linear equation (8). For a line at frequency $\omega$, $L^{-1}$ has the form of $G_\omega(t, t')$ in time domain and $G(\omega+m\omega_c, \omega+m'\omega_c)$ in frequency domain.

3. To each vertex, assign operator $-F_n/n!$ and operate it on the product of incoming lines with a permutation factor to compute the corresponding polynomial.

4. To the outgoing external line, assign $L^{-1}$ for the final AC or periodic AC calculation.

These rules are analogous to the Feynman rules [6]. Applying these rules for the Volterra series (or the Volterra approximation) to the diagrams in FIGS. 3 and 4 results in:

$$v_{\omega_1-\omega_2}^{(2)} = -\frac{1}{L} \cdot F_2 \cdot v_{\omega_1}^{(1)} \cdot v_{-\omega_2}^{(1)} \tag{31}$$

and $$v_{2\omega_1-\omega_2}^{(3)} = \frac{1}{L} \cdot F_2 \cdot v_{-\omega_2}^{(1)} \cdot \left(\frac{1}{L} \cdot \frac{1}{2!} F_2 \cdot v_{\omega_1}^{(1)} \cdot v_{\omega_1}^{(1)}\right) + \tag{32}$$
$$\frac{1}{L} \cdot F_2 \cdot v_{\omega_1}^{(1)} \cdot \left(\frac{1}{L} \cdot F_2 \cdot v_{\omega_1}^{(1)} \cdot v_{-\omega_2}^{(1)}\right) -$$
$$\frac{1}{L} \cdot \frac{1}{2} \cdot F_3 \cdot v_{\omega_1}^{(1)} \cdot v_{\omega_1}^{(1)} \cdot v_{-\omega_2}^{(1)}.$$

Equations (31) and (32) are equivalent to equations (27)-(30). Replacing $v^{(1)}$ with $L^{-1} \cdot s$ in equation (31) and equation (32) yields the 2nd and 3rd order Volterra kernels for $\omega_1-\omega_2$ and $2\omega_1-\omega_2$ respectively.

Similarly, for the Born approximation we have:

1. To each incoming external line, assign $u_{\omega_1}^{(n)}$ where $\omega$ is the RF frequency of the line.

2. To each internal line, assign operator $-L^{-1}$

3. To each vertex, assign nonlinear function $-F_{NL,\omega}(\cdot)$, where $\omega$ is the RF frequency of the outgoing line of the vertex. The input variable to the function $-F_{NL,\omega}(\cdot)$ is the sum of incoming lines with distinct frequencies. If a vertex has multiple incoming lines at an identical frequency, only the one with highest order is included in the input to $-F_{NL,\omega(\cdot)}$ because it already contains all previous orders.

4. To the outgoing external line, assign $-L^{-1}$ for the final AC or period AC calculation.

Applying these rules for the Born approximation to the diagrams in FIGS. 3 and 4 results in:

$$u^{(2)}_{\omega_1-\omega_2} = -\frac{1}{L} F_{NL,\omega_1-\omega_2}(\cdot)\left[u^{(1)}_{\omega_1} + u^{(1)}_{-\omega_2}\right] \quad (33)$$

and $$u^{(3)}_{2\omega_1-\omega_2} = -\frac{1}{L} F_{NL,2\omega_1-\omega_2}(\cdot)\left[u^{(1)}_{-\omega_2} - \frac{1}{L} F_{NL,2\omega_1}(\cdot) u^{(1)}_{\omega_1}\right] - \frac{1}{L} F_{NL,2\omega_1-\omega_2}(\cdot)\left[u^{(1)}_{\omega_1} - \frac{1}{L} F_{NL,\omega_1-\omega_2}(\cdot)(u^{(1)}_{\omega_1} + u^{(1)}_{-\omega_2})\right] - \frac{1}{L} F_{NL,2\omega_1-\omega_2}(\cdot)\left[u^{(1)}_{\omega_1} + u^{(1)}_{-\omega_2}\right]. \quad (34)$$

Note that in the first and third terms of equation (34) we use one $u^{(1)}_{\omega_1}$ to represent the two $\omega_1$ incoming lines at vertices $F_{NL,2\omega_2}$ and $F_{NL,2\omega_1-\omega_2}$. Equations (24)-(26) can be obtained from equation (34) by combining the three terms with $F_{NL,2\omega_2-\omega_2}(\cdot)$ into one and eliminating identical terms in equation (34). (FIGS. 3 and 4 correspond to FIGS. 1 and 2 respectively.) Using the diagrammatic method, we can systematically construct Born approximations or Volterra series for calculating (or representing) any high-order perturbation. That is, the rules described above can be implemented as methods for calculating perturbations to any order using the Born approximation or the Volterra series. Alternatively, perturbations can be calculated at higher orders by automated software for symbolic manipulation of polynomial and multinomial functions.

5 Computational Results

Tests were performed on five circuits including an LNA and a mixer. FIG. 6 shows basic circuit information (e.g., number of active and passive elements and number of nodes), and FIG. 7 shows the relevant operating parameters (i.e., RF frequencies $\omega_1$, $\omega_2$ and LO frequencies $\omega_c$).

Intermodulation products were calculated using the Born approximation in frequency domain (e.g, as in FIGS. 1 and 2), and the results (or representations) were compared with 2-tone (for the LNA) and 3-tone (for the mixer) harmonic balance (HB) simulations [3]. FIG. 8 shows the calculated IM2 at two different RF power levels in Mixer1 and Mixer2 at 0.88 MHz and 0.2 MHz, respectively (i.e., as values for $\omega_1-\omega_2$). FIG. 9 shows the calculated IM3 in LNA, Mixer2, Mixer3 and Mixer4 at 2.452 GHz, 2.2 MHz, 30 MHz and 80 KHz, respectively (i.e., as values for $2\omega_1-\omega_2$ for the LNA and for $2\omega_1-\omega_{2-\omega_c}$ for the mixers). (Here the Born approximation is denoted as a "perturbation" in the figures. Note that the $\omega_1$-component of the input was used to determine the RF power.) These perturbation results are in excellent agreement with multi-tone simulations. It is worthwhile to point out that standard device models such as BSIM3 and BJT are used in the simulations. As noted above, Volterra series calculations are generally not possible without modifying the models to compute 2nd and 3rd order derivatives.

To verify the scaling behavior of IM2/IM43 at different RF signal levels, we computed the slope of IM2/IM3 power as a function of RF input power using the results shown in FIGS. 8 and 9. The IM2 slopes were estimated to be 2.00006 dB/dB in Mixer1 and 2.0083 dB/dB in Mixer2. The IM3 slopes in LNA, Mixer2, Mixer3 and Mixer4 were estimated to be 3.0039 dB/dB, 2.9976 dB/dB, 3.0097 dB/dB and 2.99998 dB/dB, respectively. These results, which are very close to the theoretical values of 2 dB/dB and 3 dB/dB, demonstrate that at the specified power level nonlinear distortion is dominated by leading order effects and higher order contributions are insignificant in these circuits. Therefore, IP2 and IP3 can be accurately extracted from the calculations.

FIG. 10 shows a speed comparison between the Born approximation and multi-tone simulation. Here the computation time used to solve DC or periodic operating point was included for the Born approximation (i.e., perturbation method). According to these results, performance is improved by three to six time using the perturbative method.

6 Conclusion

As demonstrated above by embodiments of the present invention, IP2 and IP3 can be calculated by using 2nd and 3rd order Born approximations under weakly nonlinear condition. The approach does not require high-order device derivatives and, in general, can be implemented without modification of device models. The approach is formulated as successive small signal calculations. Since RF signals are treated as perturbation to the operating point, the dynamic range only needs to cover RF excitations. In general, the computation takes one DC or periodic steady-state calculation at zero RF input and three (for IP2) or five (for IP3) AC or periodic AC solutions, regardless of the number of harmonics used. As demonstrated by the calculation shown above, this approach gives results that are consistent with the conventional multi-tone simulation methods for calculating IP2 and IP3. However this approach is typically much more efficient compared to the conventional simulations.

A diagrammatic representation was introduced to analyze nonlinear interactions at a given order. Relevant intermediate harmonics in lower-order approximations are identified using this diagrammatic technique. Perturbations can be constructed directly from diagrams in a systematic way. The approach can be applied to calculating other high-order distortions such as arbitrary intermodulation products (IMn), and these distortions can be used to calculate corresponding intermodulation intercept points (IPn)

Additional embodiments relate to an apparatus that includes a computer with instructions for carrying out any one of the above-described methods. In this context the computer may be a general-purpose computer including, for example, a central processing unit, memory, storage and Input/Output devices. However, the computer may include a specialized microprocessor or other hardware for carrying out some or all aspects of the methods. Additional embodiments also include a computer-readable medium that stores (e.g., tangibly embodies) a computer program for carrying out any one of the above-described methods by means of a computer.

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

7 References

The following references are related to the disclosed subject matter:

[1] J. Bussgang, L. Ehrman, and J. Graham. Analysis of nonlinear systems with multiple inputs. *Proc. IEEE*, 62:1088-1119, August 1974.

[2] S. Chisholm and L. Nagel. Efficient computer simulation of distortion in electronic circuits. *IEEE Trans. on Circuits and Systems,* 20(6):742-745, November 1973.

[3] P. Feldmann, B. Melville, and D. Long. Efficient frequency domain analysis of large nonlinear analog circuits. *Proc. Custom Integrated Circuits Conf.,* pages 461-464, 1996.

[4] D. Feng, J. Phillips, K. Nabors, K. Kundert, and J. White. Efficient computation of quasi-periodic circuit operating conditions via a mixed frequency/time approach. *Proc. of 36th DAC* pages 635-640, June 99.

[5] J. Haywood and Y. L. Chow. Intermodulation distortion analysis using a frequency-domain harmonic balance technique. *IEEE Trans. on Microwave Theory and Techniques,* 36(8):1251-1257, August 1988.

[6] C. Itzykson and J. Zuber. *Quantum Field Theory.* McGraw-Hill Inc., 1980.

[7] Y. Kuo. Distortion analysis of bipolar transistor circuits. *IEEE Trans. on Circuits and Systems,* 20(6):709-716, November 1973.

[8] T. Lee. *The Design of CMOS Radio-Frequency Integrated Circuits.* Cambridge University Press, Cambridge, UK, 1998.

[9] B. Leon and D. Schaefer. Volterra series and picard iteration for nonlinear circuits and systems. *IEEE Trans. on Circuits and Systems,* 25(9):789-793, September 1978.

[10] P. Li and L. Pileggi. Efficient per-nonlinearity distortion analysis for analog and rf circuits. *IEEE Trans. on Computer-Aided Design of Integrated Circuits and Systems,* 22(10):1297-1309, October 2003.

[11] S. Maas. *Nonlinear Microwave Circuits.* Artech House, Norwood, Mass., 1988.

[12] S. Narayanan. Application of volterra series to intermodulation distortion analysis of transistor feedback amplifiers. *IEEE Trans. on Circuits and Systems,* 17(4): 518-527, November 1970.

[13] B. Razavi. *RF Microelectronics.* Prentice Hall, Upper Saddle River, N.J., 1998.

[14] J. Sakurai. *Modern Quantum Mechanics.* The Benjamin/Cummings Publishing Company, Inc., Menlo Park, Calif., 1985.

[15] R. Telichevesky, K. Kundert, and J. White. Efficient ac and noise analysis of two-tone rf circuits. *Proc. of 33th DAC* pages 292-297, June 96.

[16] P. Wambacq, G. Gielen, P. Kinget, and W. Sansen. High-frequency distortion analysis of analog integrated circuits. *IEEE Trans. on Circuits and Systems II,* 46(3):335-345, March 1999.

[17] F. Yuan and A. Opal. Distortion analysis of periodically switched nonlinear circuits using time-varying volterra series. *IEEE Trans. on Circuits and Systems I,* 48(6):726-738, June 2001.

What is claimed is:

1. A method of analyzing distortion in a circuit, comprising:
   determining an operating point for the circuit, the circuit having a linear offset and a nonlinear offset at the operating point;
   determining a first-order solution from the linear offset and an input having a first input frequency and a second input frequency;
   determining a harmonic component of the nonlinear offset at a difference between the first input frequency and the second input frequency; and
   determining a second-order solution from the linear offset and the harmonic component of the nonlinear offset at the difference between the first input frequency and the second input frequency, wherein the second-order solution provides an estimate for a second-order intermodulation product for the circuit.

2. A method according to claim 1, further comprising:
   determining an estimate for a second-order intercept point for the circuit from the second-order solution and the first-order solution.

3. A method according to claim 2, wherein determining the estimate for the second-order intercept point includes:
   calculating an intersection between a linear representation of the second-order solution and a linear representation of the first-order solution, wherein the linear representation of the second-order solution has a slope of about 2 dB/dB and the linear representation of the first-order solution has a slope of about 1 dB/dB.

4. A method according to claim 3, wherein determining the linear representation of the first-order solution includes extracting a component from the first-order solution corresponding to one of the first frequency and the second frequency.

5. A method according to claim 1, wherein the operating point is a DC (direct current) operating point or a periodic operating point.

6. A method according to claim 1, further comprising: calculating a DFT (Discrete Fourier Transform) of the nonlinear offset; wherein
   determining the harmonic component of the nonlinear offset at the difference between the first input frequency and the second input frequency includes selecting a component of the DFT at the difference between the first input frequency and the second input frequency.

7. A method according to claim 1, wherein determining the second-order solution includes: solving a system defined by the linear offset with an input defined by the harmonic component of the nonlinear offset at the difference between the first input frequency and the second input frequency.

8. A method according to claim 1, wherein the linear offset characterizes a linearized response to input signals at the operating point, and the nonlinear offset characterizes an additional response to input signals at the operating point.

9. A method of analyzing distortion in a circuit, comprising:
   determining an operating point for the circuit, the circuit having a linear offset and a nonlinear offset at the operating point;
   determining a first-order solution from the linear offset and an input having a first input frequency and a second input frequency;
   determining a harmonic component of the nonlinear offset at a difference between the first input frequency and the second input frequency;
   determining a harmonic component of the nonlinear offset at twice the first input frequency;
   determining a second-order solution from the linear offset and the harmonic component of the nonlinear offset at the difference between the first input frequency and the second input frequency;
   determining a second-order solution from the linear offset and the harmonic component of the nonlinear offset at twice the first input frequency;
   determining a harmonic component of the nonlinear offset at a difference between twice the first input frequency and the second input frequency; and
   determining a third-order solution from the linear offset and the harmonic component of the nonlinear offset at the difference between twice the first input frequency and the second input frequency, wherein the third-order solution provides an estimate for a third-order intermodulation product for the circuit.

10. A method according to claim 9, further comprising:
determining an estimate for a third-order intercept point for the circuit from the third-order solution and the and the first-order solution.

11. A method according to claim 10, wherein determining the estimate for the third-order intercept point includes:
calculating an intersection between a linear representation of the third-order solution and a linear representation of the first-order solution, wherein the linear representation of the third-order solution has a slope of about 3 dB/dB and the linear representation of the first-order solution has a slope of about 1 dB/dB.

12. A method according to claim 11, wherein determining the linear representation of the first-order solution includes extracting a component from the first-order solution corresponding to one of the first frequency and the second frequency.

13. A method according to claim 9, further comprising:
calculating a DFT of the nonlinear offset; wherein
determining the harmonic component of the nonlinear offset at the difference between the first input frequency and the second input frequency includes selecting a component of the DFT at the difference between the first input frequency and the second input frequency,
determining the harmonic component of the nonlinear offset at twice the first input frequency includes selecting a component of the DFT at twice the first input frequency; and
determining the harmonic component of the nonlinear offset at the difference between twice the first input frequency and the second input frequency includes selecting a component of the DFT at the difference between twice the first input frequency and the second input frequency.

14. A method of analyzing distortion in a circuit, comprising:
a step for representing an operating point for the circuit, the circuit having a linear offset and a nonlinear offset at the operating point;
a step for representing a first-order solution from the linear offset and an input having a first input frequency and a second input frequency;
a step for representing a harmonic component of the nonlinear offset at a difference between the first input frequency and the second input frequency; and
a step for representing a second-order solution from the linear offset and the harmonic component of the nonlinear offset at the difference between the first input frequency and the second input frequency, wherein the second-order solution provides an estimate for a second-order intermodulation product for the circuit.

15. A method according to claim 14, further comprising:
a step for representing a second-order intercept point for the circuit from the second-order solution and the first-order solution.

16. A method according to claim 14, further comprising:
a step for representing a harmonic component of the nonlinear offset at twice the first input frequency;
a step for representing a second-order solution from the linear offset and the harmonic component of the nonlinear offset at twice the first input frequency;
a step for representing a harmonic component of the nonlinear offset at a difference between twice the first input frequency and the second input frequency; and
a step for representing a third-order solution from the linear offset and the harmonic component of the nonlinear offset at the difference between twice the first input frequency and the second input frequency, wherein the third-order solution provides an estimate for a third-order intermodulation product for the circuit.

17. A method according to claim 16, further comprising:
a step for representing a third-order intercept point for the circuit from the third-order solution and the and the first-order solution.

18. An apparatus for analyzing distortion in a circuit, the apparatus comprising a computer for executing computer instructions, wherein the computer includes computer instructions for:
determining an operating point for the circuit, the circuit having a linear offset and a nonlinear offset at the operating point;
determining a first-order solution from the linear offset and an input having a first input frequency and a second input frequency;
determining a harmonic component of the nonlinear offset at a difference between the first input frequency and the second input frequency; and
determining a second-order solution from the linear offset and the harmonic component of the nonlinear offset at the difference between the first input frequency and the second input frequency, wherein the second-order solution provides an estimate for a second-order intermodulation product for the circuit.

19. An apparatus according to claim 18, wherein the computer further includes computer instructions for:
determining an estimate for a second-order intercept point for the circuit from the second-order solution and the first-order solution.

20. An apparatus according to claim 19, wherein determining the estimate for the second-order intercept point includes:
calculating an intersection between a linear representation of the second-order solution and a linear representation of the first-order solution, wherein the linear representation of the second-order solution has a slope of about 2 dB/dB and the linear representation of the first-order solution has a slope of about 1 dB/dB.

21. An apparatus according to claim 18, wherein
the computer further includes computer instructions for calculating a DFT of the nonlinear offset, and
determining the harmonic component of the nonlinear offset at the difference between the first input frequency and the second input frequency includes selecting a component of the DFT at the difference between the first input frequency and the second input frequency.

22. An apparatus according to claim 18, wherein the computer further includes computer instructions for
determining a harmonic component of the nonlinear offset at twice the first input frequency;
determining a second-order solution from the linear offset and the harmonic component of the nonlinear offset at twice the first input frequency;
determining a harmonic component of the nonlinear offset at a difference between twice the first input frequency and the second input frequency; and
determining a third-order solution from the linear offset and the harmonic component of the nonlinear offset at the difference between twice the first input frequency and the second input frequency, wherein the third-order solution provides an estimate for a third-order intermodulation product for the circuit.

23. An apparatus according to claim 22, wherein the computer further includes computer instructions for:
  determining an estimate for a third-order intercept point for the circuit from the third-order solution and the and the first-order solution.

24. An apparatus according to claim 23, wherein determining the estimate for the third-order intercept point includes:
  calculating an intersection between a linear representation of the third-order solution and a linear representation of the first-order solution, wherein the linear representation of the third-order solution has a slope of about 3 dB/dB and the linear representation of the first-order solution has a slope of about 1 dB/dB.

25. An apparatus according to claim 22, wherein
  the computer further includes computer instructions for calculating a DFT of the nonlinear offset,
  determining the harmonic component of the nonlinear offset at the difference between the first input frequency and the second input frequency includes selecting a component of the DFT at the difference between the first input frequency and the second input frequency,
  determining the harmonic component of the nonlinear offset at twice the first input frequency includes selecting a component of the DFT at twice the first input frequency, and
  determining the harmonic component of the nonlinear offset at the difference between twice the first input frequency and the second input frequency includes selecting a component of the DFT at the difference between twice the first input frequency and the second input frequency.

26. An apparatus according to claim 18, wherein determining the second-order solution includes: solving a system defined by the linear offset with an input defined by the harmonic component of the nonlinear offset at the difference between the first input frequency and the second input frequency.

27. An apparatus according to claim 18, wherein the linear offset characterizes a linearized response to input signals at the operating point, and the nonlinear offset characterizes an additional response to input signals at the operating point.

28. A computer-readable medium that stores a computer program for analyzing distortion in a circuit, the computer program comprising instructions for:
  determining an operating point for the circuit, the circuit having a linear offset and a nonlinear offset at the operating point;
  determining a first-order solution from the linear offset and an input having a first input frequency and a second input frequency;
  determining a harmonic component of the nonlinear offset at a difference between the first input frequency and the second input frequency; and
  determining a second-order solution from the linear offset and the harmonic component of the nonlinear offset at the difference between the first input frequency and the second input frequency, wherein the second-order solution provides an estimate for a second-order intermodulation product for the circuit.

29. A computer-readable medium according to claim 28, wherein the computer program further includes instructions for:
  determining an estimate for a second-order intercept point for the circuit from the second-order solution and the first-order solution.

30. A computer-readable medium according to claim 29, wherein determining the estimate for the second-order intercept point includes:
  calculating an intersection between a linear representation of the second-order solution and a linear representation of the first-order solution, wherein the linear representation of the second-order solution has a slope of about 2 dB/dB and the linear representation of the first-order solution has a slope of about 1 dB/dB.

31. A computer-readable medium according to claim 28, wherein
  the computer program further includes instructions for calculating a DFT of the nonlinear offset, and
  determining the harmonic component of the nonlinear offset at the difference between the first input frequency and the second input frequency includes selecting a component of the DFT at the difference between the first input frequency and the second input frequency,.

32. A computer-readable medium according to claim 28, wherein the computer program further includes instructions for:
  determining a harmonic component of the nonlinear offset at twice the first input frequency;
  determining a second-order solution from the linear offset and the harmonic component of the nonlinear offset at twice the first input frequency;
  determining a harmonic component of the nonlinear offset at a difference between twice the first input frequency and the second input frequency; and
  determining a third-order solution from the linear offset and the harmonic component of the nonlinear offset at the difference between twice the first input frequency and the second input frequency, wherein the third-order solution provides an estimate for a third-order intermodulation product for the circuit.

33. A computer-readable medium according to claim 32, wherein the computer program further includes instructions for:
  determining an estimate for a third-order intercept point for the circuit from the third-order solution and the and the first-order solution.

34. A computer-readable medium according to claim 33, wherein determining the estimate for the third-order intercept point includes:
  calculating an intersection between a linear representation of the third-order solution and a linear representation of the first-order solution, wherein the linear representation of the third-order solution has a slope of about 3 dB/dB and the linear representation of the first-order solution has a slope of about 1 dB/dB.

35. A computer-readable medium according to claim 32, wherein
  the computer program further includes instructions for calculating a DFT of the nonlinear offset,
  determining the harmonic component of the nonlinear offset at the difference between the first input frequency and the second input frequency includes selecting a component of the DFT at the difference between the first input frequency and the second input frequency,
  determining the harmonic component of the nonlinear offset at twice the first input frequency includes selecting a component of the DFT at twice the first input frequency, and
  determining the harmonic component of the nonlinear offset at the difference between twice the first input frequency and the second input frequency includes selecting a component of the DFT at the difference between twice the first input frequency and the second input frequency.

36. A computer-readable medium according to claim 28, wherein determining the second-order solution includes: solving a system defined by the linear offset with an input defined by the harmonic component of the nonlinear offset at the difference between the first input frequency and the second input frequency.

37. A computer-readable medium according to claim 28, wherein the linear offset characterizes a linearized response to input signals at the operating point, and the nonlinear offset characterizes an additional response to input signals at the operating point.

* * * * *

UNITED STATES PATENT AND TRADEMARK OFFICE
CERTIFICATE OF CORRECTION

PATENT NO. : 7,774,176 B2
APPLICATION NO. : 11/303049
DATED : August 10, 2010
INVENTOR(S) : Fangyi Rao et al.

It is certified that error appears in the above-identified patent and that said Letters Patent is hereby corrected as shown below:

On the face page, in field (57), under "Abstract", in column 2, line 1, delete "pertubative" and insert -- perturbative --, therefor.

In column 1, line 33, delete "$2\omega_1-\omega_{2-\omega c}$" and insert -- $2\omega_1-\omega_2-\omega_c$ --, therefor.

In column 2, line 62, delete "input-frequency" and insert -- input frequency --, therefor.

In column 3, line 50, delete "pertubative" and insert -- perturbative --, therefor.

In column 4, line 67, delete " $F_{NL}(u^{(n-1)})$ " and insert -- $F_{NL}(u^{(n-1)})$ --, therefor.

In column 6, lines 44-45, delete " $F_{NL}(u(t)) = \sum_{\vec{r}} t\{\vec{k},\vec{\theta}\} \cdot F_{NL}\left(\sum_{\vec{r}'} e^{i\vec{r}\cdot\vec{\theta}} u_{\vec{r}}(t)\right)$ " and insert -- $F_{NL,\vec{k}}(u(t)) = \sum_{\vec{r}} t\{\vec{k},\vec{\theta}\} \cdot F_{NL}\left(\sum_{\vec{r}'} e^{i\vec{r}\cdot\vec{\theta}} u_{\vec{r}}(t)\right)$ --, therefor.

In column 9, line 58, delete "need-to" and insert -- need to --, therefor.

In column 10, line 58, delete "$-L^{-1}$" and insert -- $-L^{-1}$. --, therefor.

In column 10, line 64, delete " $-F_{NL,\omega}(\cdot)$ " and insert -- $-F_{NL,\omega}(\cdot)$ --, therefor.

In column 11, lines 19-20, delete " $F_{NL,2\omega_2-\omega_1}(\cdot)$ " and insert -- $F_{NL,2\omega_1-\omega_2}(\cdot)$ --, therefor.

In column 11, line 49, delete "$2\omega_1-\omega_{2-\omega c}$" and insert -- $2\omega_1-\omega_2-\omega_c$ --, therefor.

In column 11, line 58, delete "IM2/IM43" and insert -- IM2/IM3 --, therefor.

In column 12, line 39, delete "(IPn)" and insert -- (IPn). --, therefor.

In column 15, line 5, in Claim 10, after "solution and the" delete "and the".

Signed and Sealed this

Twenty-first Day of December, 2010

David J. Kappos
*Director of the United States Patent and Trademark Office*

In column 16, line 9, in Claim 17, after "solution and the" delete "and the".

In column 17, line 4, in Claim 23, after "solution and the" delete "and the".

In column 18, line 18, in Claim 31, delete "frequency,." and insert -- frequency. --, therefor.

In column 18, line 41, in Claim 33, after "solution and the" delete "and the".